(12) United States Patent
Emami et al.

(10) Patent No.: US 7,273,813 B2
(45) Date of Patent: Sep. 25, 2007

(54) WAFER CLEANING SOLUTION FOR COBALT ELECTROLESS APPLICATION

(75) Inventors: Ramin Emami, San Jose, CA (US); Timothy Weidman, Sunnyvale, CA (US); Sergey Lopatin, Santa Clara, CA (US); Hongbin Fang, Mountainview, CA (US); Arulkumar Shanmugasundram, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 215 days.

(21) Appl. No.: 11/053,501

(22) Filed: Feb. 8, 2005

(65) Prior Publication Data
US 2006/0174912 A1 Aug. 10, 2006

(51) Int. Cl.
H01L 21/44 (2006.01)
(52) U.S. Cl. .............................. 438/678; 257/E21.174
(58) Field of Classification Search ............... 438/678, 438/597; 257/E21.174
See application file for complete search history.

(56) References Cited

U.S. PATENT DOCUMENTS 6,572,453 B1  6/2003  Wijekoon et al.
2001/0052351 A1  12/2001  Brown et al.
2005/0101130 A1*  5/2005  Lopatin et al. ............. 438/678

* cited by examiner

Primary Examiner—Scott B. Geyer
Assistant Examiner—Elias Ullah
(74) Attorney, Agent, or Firm—Patterson & Sheridan, LLP

(57) ABSTRACT

A method and cleaning solution that removes contaminants from a dielectric material and polished surfaces of copper interconnect structures prior to an electroless deposition of a capping layer without substantially adversely affecting the interconnect formed therefrom are disclosed. The cleaning solution includes combinations of a core mixture and sulfuric acid or sulfonic compounds such as sulfonic acids that include methanesulfonic acid. In one embodiment, the core mixture includes a citric acid solution and a pH adjuster such as tetra-methyl ammonium hydroxide or ammonia. One embodiment of the method includes providing a planarized substrate, applying the cleaning solution to the substrate to simultaneously clean at least one metal feature and a dielectric material of the substrate, and depositing the metal capping layer selectively on the at least one metal feature using electroless deposition.

12 Claims, 2 Drawing Sheets

WAFER CLEANING SOLUTION FOR COBALT ELECTROLESS APPLICATION

BACKGROUND OF THE INVENTION

1. Field of the Invention

Embodiments of the invention generally relate to a cleaning solution for use during the fabrication of semiconductor devices. More particularly, the invention relates to cleaning solutions and methods for using the cleaning solutions prior to depositing metal alloy capping layers over conductive layers in electronic devices.

2. Description of the Related Art

Recent improvements in circuitry of ultra-large scale integration (ULSI) on substrates indicate that future generations of semiconductor devices will require multi-level metallization with smaller geometric features. The multi-level interconnects that lie at the heart of this technology require planarization of interconnect features formed in high aspect ratio features, including contacts, vias, lines and other features. Reliable formation of these interconnect features is very important to the success of ULSI and to the continued effort to increase circuit density and quality on individual substrates and die as features decrease below 0.13 µm in size.

Currently, copper and its alloys have become the metals of choice for sub-micron interconnect technology because copper has a lower resistivity than aluminum, (1.67 µΩ-cm compared to 3.1 µΩ-cm for aluminum), a higher current carrying capacity, and significantly higher electromigration resistance. However, copper diffuses through substrate and may still electromigrate, thereby requiring a barrier layer between the copper and the substrate. Also, copper readily forms copper oxide when exposed to atmospheric conditions such as environments outside of processing equipment. Copper oxide formation increases the resistance of metal layers (e.g., copper interconnects) and reduces the reliability of the overall circuit.

Selectively depositing a capping layer of a metal alloy on the copper provides an efficient barrier to copper diffusion, electromigration and oxidation. This appears most readily accomplished using an electroless plating process selective for copper relative to a dielectric material of the substrate. In this manner, the capping layers that may be made from cobalt alloys such as cobalt tungsten boron (CoWB) or cobalt tungsten phosphorous (CoWP) may be deposited from a plating solution that may either be self initiated or activated by displacement plating, such as with palladium or any other relevant catalyst. However, copper oxide detrimentally affects electroless deposition which requires a surface capable of electron transfer for nucleation since oxidized surfaces cannot participate in proper electron transfer and copper oxide may contain contaminants within which interfere with alloy deposition. Further, the dielectric material may have contaminants thereon that the capping layer deposits to during the electroless plating process. Deposits of the capping layer on the dielectric material and extensions of the capping layer grown at the edges of the copper lines can cause shorts in the electrical circuit. Contaminants on the copper and the dielectric material include oxides, copper oxides, copper-organic complexes, silicon oxides, benzotraixole (BTA), TTA, resist, polymeric residue, derivatives thereof and combinations thereof. Thus, the substrate is cleaned of various contaminants prior to depositing the capping layer in order to selectively and efficiently deposit the capping layer on the copper. The cleaning of the substrate is typically done after polishing or leveling the copper or other conductive material, such as by chemical mechanical polishing (CMP), and prior to deposition of the capping layer. The cleaning, the optional activating, and the depositing of the capping layer may be performed on the substrate in multiple steps.

Various cleaning solutions that are known and used to clean copper and dielectric materials at other stages during the manufacture of the semiconductor have disadvantages when used prior to depositing the capping layer. Examples of known cleaning solutions for exposing to the substrate in order to clean the dielectric material or the copper include acidic solutions (e.g. hydrofluoric acid (HF), citric acid, amino acids such as glycine, sulfuric acid ($H_2SO_4$) and/or hydrochloric acid (HCl)) and Electra Clean™ solutions commercially available from Applied Materials, Inc., of Santa Clara, Calif. However, the prior cleaning solutions can corrode the copper, etch the copper, roughen the copper surface, and damage the dielectric material. Additionally, the copper grain boundaries can be decorated by the prior cleaning solutions thereby detrimentally decorating the geometric grain or crystal structure of the copper. Further, the prior cleaning solutions can go between the barrier layer and the copper or between the barrier layer and the dielectric material and damage these boundaries.

Therefore, there exists a need for cleaning solutions and methods for using the cleaning solutions that can simultaneously clean conductive layers and dielectric materials prior to depositing metal alloy capping layers over the conductive layers. There exists a further need for cleaning solutions and methods that more effectively remove contaminants without substantially adversely affecting the interconnect formed therefrom.

SUMMARY OF THE INVENTION

The invention generally relates to a method and cleaning solution for removing contaminants from a dielectric material and polished surfaces of copper interconnect structures prior to an electroless deposition of a capping layer without substantially adversely affecting the interconnect formed therefrom. The cleaning solution includes combinations of a core mixture and sulfuric acid or sulfonic compounds such as sulfonic acids that include methanesulfonic acid. In one embodiment, the core mixture includes a citric acid solution and a pH adjuster such as tetra-methyl ammonium hydroxide or ammonia. One embodiment of the method includes providing a planarized substrate, applying the cleaning solution to the substrate to simultaneously clean at least one metal feature and a dielectric material of the substrate, and depositing the metal capping layer selectively on the at least one metal feature using electroless deposition.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
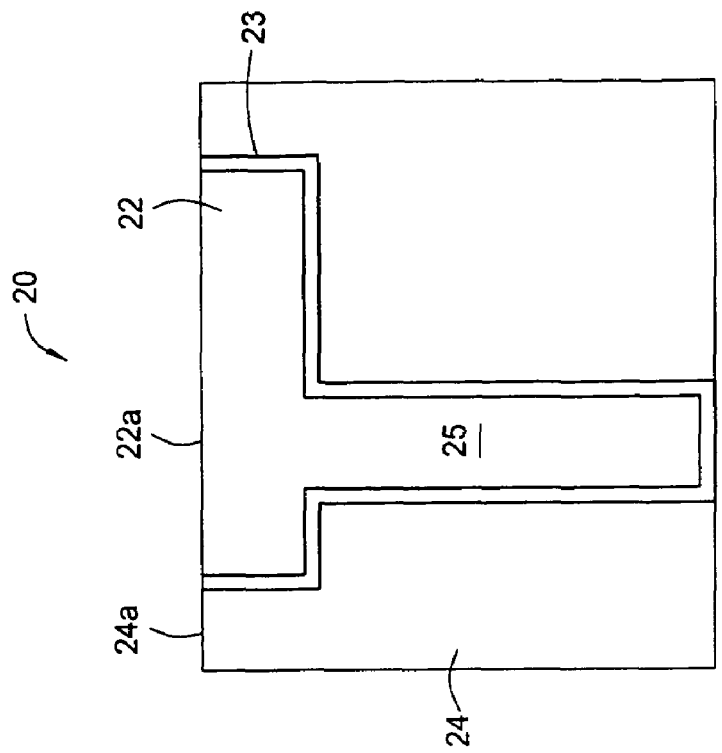
FIG. 1 is a schematic cross-section view of an exemplary substrate structure prior to formation of a selective capping layer over a copper feature.

Embodiments of the invention generally relate to methods and cleaning solutions for removing contaminants from a dielectric material and polished surfaces of copper interconnect structures prior to depositing a capping layer. FIG. 1 shows a schematic cross-section view of an exemplary substrate structure 20 prior to formation of a capping layer over a copper feature. The substrate structure includes a low dielectric constant (low-k) dielectric layer 24 formed over a substrate (not shown), such as a semiconductor substrate or glass substrate, or formed over a substrate as well as other materials formed over the substrate. Examples of low-k materials making up the dielectric layer 24 include Black Diamond™ film, available from Applied Materials, Inc. of Santa Clara, Calif.; CORAL™ film, available from Novellus Systems Inc. of San Jose, Calif., AURORA™ film available from ASM International of Bilthoven, Netherlands; organosilanes or organosiloxanes; spin on dielectrics; carbon doped oxides; silicates; and any other suitable material.

The low-k dielectric layer 24 is patterned and etched to form an aperture 25, such as a via, trench, contact hole, or line. A barrier layer 23 such as a tantalum-containing barrier layer or other suitable barrier layer is formed over the aperture 25. Then, a copper layer 22 is formed over the barrier layer 23 filling the aperture 25. A seed layer (not shown) may be formed between the barrier layer 23 and the copper layer 22 to help deposition of the copper layer 22. The copper layer 22, the seed layer, and the barrier layer 23 are typically removed from the upper surface of the low-k dielectric layer 24 through planarization techniques, such as chemical mechanical polishing (CMP). Thus, the upper surface of the substrate structure 20 includes an exposed portion 24a of the low-k dielectric layer 24 and an exposed portion 22a of the copper layer 22. However, contaminants 21 may be left or formed on the exposed portions 24a, 22a after the CMP. The contaminants 21 include oxides, copper oxides, copper-organic complexes, silicon oxides, BTA, TTA, polymeric residue, derivatives thereof and combinations thereof.

Figure 2:
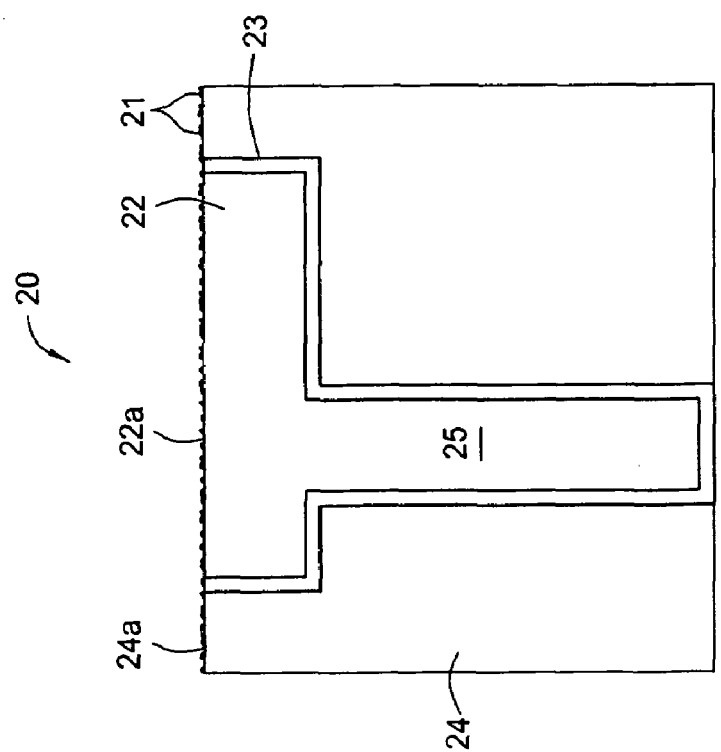
FIG. 2 is a schematic cross-section view of the substrate structure after cleaning the substrate structure with a cleaning solution according to an embodiment of the invention.

FIG. 2 illustrates the substrate structure 20 after exposing the substrate structure 20 to a cleaning solution. As seen, the cleaning solution removes the contaminants 21 from both the exposed portion 24a of the low-k dielectric layer 24 and the exposed portion 22a of the copper layer 22. The cleaning solution provides a copper etch rate of less than 30 Å/min such that less copper is removed from the exposed portion 22a than with other cleaning solutions used under the same conditions. The cleaning solution provides a smoother exposed portion 22a of the copper layer 22 than other cleaning solutions used under the same conditions. Further, embodiments of the cleaning solution of the invention remove more contaminants 21 from the exposed portions 22a, 24a and provide less corrosion to the exposed portion 22a of the copper layer 22 than other cleaning solutions used under the same conditions. Additionally, the cleaning solution does not decorate the copper grain boundaries or go between the barrier layer 23 and the copper layer 22 or between the barrier layer 23 and the dielectric layer 24 and damage these boundaries.

The cleaning solution includes a core mixture that is mixed with sulfuric acid ($H_2SO_4$) or sulfonic compounds such as sulfonic acids (e.g. methanesulfonic acid (MSA), ethanesulfonic acid, propanesulfonic acid, and benzenesulfonic acid). The $H_2SO_4$ or sulfonic compounds that mix with the core mixture have a concentration between 0.05 Normal (N) and 1 N. In one embodiment, the core mixture includes a citric acid solution at a concentration between 0.05 molar (M) and 1 M and a pH adjuster such as tetramethyl ammonium hydroxide (TMAH) or ammonia ($NH_3$). For these concentrations, the ratio of the unit volume of the core mixture to the $H_2SO_4$ or sulfonic compounds may be between 1:100 and 100:1.

The pH of the core mixture and the cleaning solution may be adjusted to a pH similar to that of a bath solution for electroless deposition such that the substrate structure 20 does not experience pH shock. Preferably, the cleaning solution has a pH of between 1.5 and 10. Thus, the preferable pH range is between 2 and 4 for acidic solutions, between 5 and 7 for neutral solutions, and between 8 and 10 for basic solutions. Most preferably, the pH of the cleaning solution is approximately 2.5.

Hydrochloric acid (HCl) (about 35-40% by volume) may be added to the cleaning solution that contains the core mixture and $H_2SO_4$ or sulfonic compounds such that the HCl concentration in the cleaning solution is less than 1 parts per billion (ppb) to 0.5% by volume. Other additives that may be added to the cleaning solution include hydrofluoric acid (HF) (49% by volume) at a concentration of 10 parts per million (ppm) to 2% by volume, MSA at a concentration of 10 ppm to 30% by volume, a complexing agent such as ethylenediaminetetraacetic acid (EDTA) at less than 1% concentration and/or poly ethylene glycol at less than 1% concentration to improve wettability. The HCl and HF additives can etch some of the low-k dielectric layer 24 to aid in cleaning of the exposed portion 24a of the low-k dielectric layer 24.

To make one embodiment of the cleaning solution, between 0.01 units of volume and 1 unit of volume of the core mixture including citric acid and a pH adjuster is mixed with between 1 and 0.01 units of volume of $H_2SO_4$ having a concentration of 0.05 N-1 N and HCl (about 35-40% by volume) such that the HCl concentration in the cleaning solution is between less than 1 ppb and 0.5% by volume. In another embodiment of the cleaning solution, between 0.01 units of volume and 1 unit of volume of the core mixture including citric acid and a pH adjuster is mixed with between 1 and 0.01 units of volume of MSA having a concentration of 0.05 N-1 N and HCl (about 35-40% by volume) such that the HCl concentration in the cleaning solution is between less than 1 ppb and 0.5% by volume.

Another example of a suitable core mixture for mixing with the $H_2SO_4$ or sulfonic compounds is an Electra Clean™ solution commercially available from Applied Materials, Inc., of Santa Clara, Calif. The Electra Clean™ solution generally includes combinations of two or more components that include a zeta potential modifier, a pH adjuster and a contamination remover. As such, the core mixture may be a combination of two or more of these components. Exemplary Electra Clean™ solutions are described in U.S. Patent Application Publication No. 2001/0052351, published Dec. 20, 2001, and herein incorporated by reference in its entirety.

The zeta potential modifier preferably comprises a weak acid such as a hydrocarboxylic acid, and most preferably citric acid. The zeta potential modifier preferably is present in the core mixture in an amount between 0.1-1.0 weight percent, and most preferably 0.3 weight percent.

The pH adjuster preferably comprises a weak base such as an amine, and most preferably comprises ammonium hydroxide, ammonium fluoride and TMAH. The pH adjuster preferably is present in the core mixture in an amount between 0.005-0.1 weight percent, and most preferably 0.025 weight percent. The exact concentration of the pH adjuster depends on the concentration of the zeta potential modifier within the core mixture.

The contamination remover preferably comprises hydrofluoric acid but may comprise other dielectric etchants such as buffered hydrofluoric acid and hydrogen peroxide. Preferably the contamination remover is present in the core mixture in an amount between 0.1-2, and most preferably 0.5, weight percent.

Figure 3:
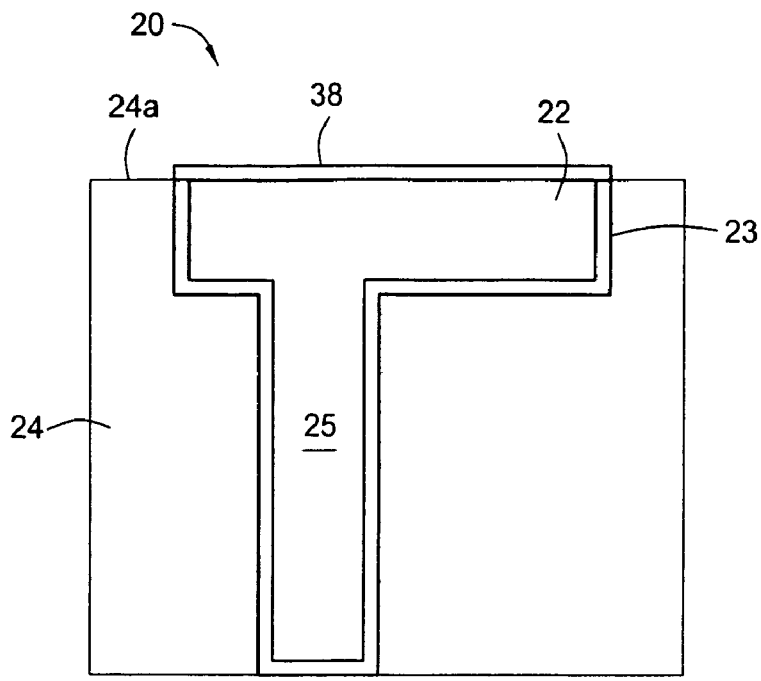
FIG. 3 is a schematic cross-section view of the substrate structure after formation of the selective capping layer over the copper feature.

FIG. 3 is a schematic cross-section view of the substrate structure 20 after formation of a capping layer 38 over the copper feature. The capping layer 38 is formed over conductive surfaces, such as the exposed potion 22a of the copper layer 22, and does not form over the exposed portion 24a of the low-k dielectric layer 24. The capping layer 38 is thicker and has a surface that is less rough than capping layers formed under the same conditions but using other cleaning solutions. Further, there is substantially no deposition of the capping layer 38 over the exposed portion 24a of the low-k dielectric layer 24 as compared with capping layers formed under the same conditions but using other cleaning solutions.

Figure 4:
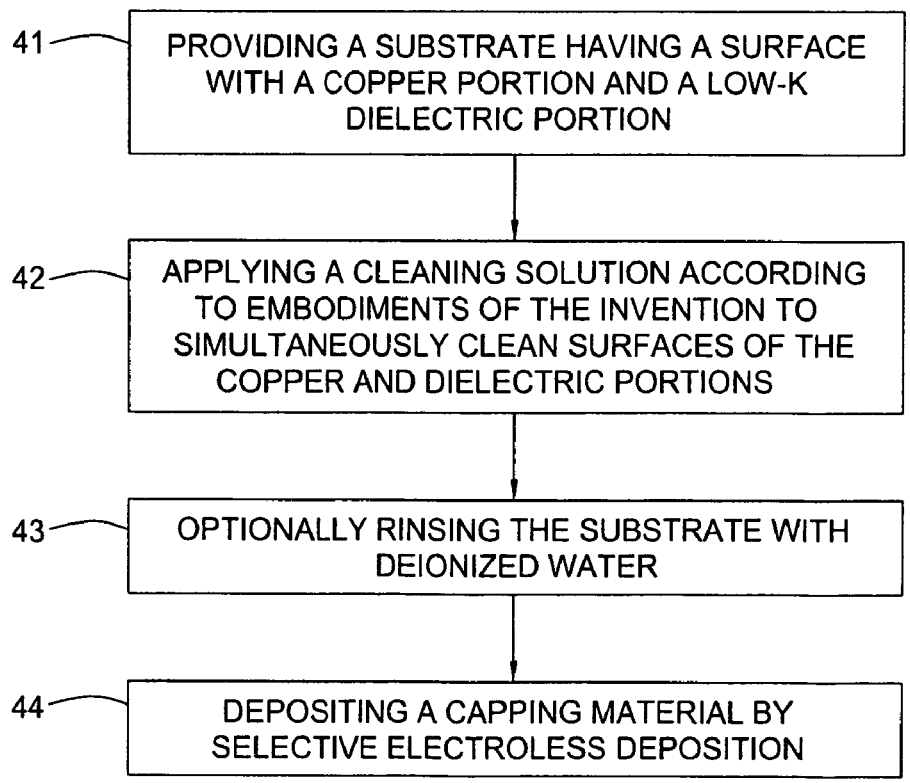
FIG. 4 is a flow chart according to one embodiment of a method for forming a capping layer over copper features of a substrate structure.

FIG. 4 is a flow chart of one embodiment of a method 40 of forming a capping layer 38 over copper features of a substrate structure. For clarity of description, the method will be described in reference to the substrate structure 20 of FIG. 1. As such, step 41 illustrates providing the substrate structure 20 with the exposed portions 22a, 24a. In step 42, the exposed portions 22a, 24a are cleaned by applying the cleaning solution to the substrate structure for a period of time (e.g. approximately 30 seconds). The cleaning solution is a combination of the core mixture and sulfuric acid or sulfonic compounds as described herein. In a next step 43, the substrate structure 20 may optionally be rinsed with deionized water. In step 44, the capping layer 38 is deposited on the exposed portion 22a of the copper layer 22 by either a self initiated or activated electroless deposition. For example, the substrate structure may be exposed to a self initiating bath for approximately 30 seconds in order to deposit the capping layer 38. The capping layer 38 may be made from cobalt alloys such as cobalt tungsten boron (CoWB) or cobalt tungsten phosphorous (CoWP), depending on the plating solution used in step 44.

While the foregoing is directed to embodiments of the invention, other and further embodiments of the invention may be devised without departing from the basic scope thereof, and the scope thereof is determined by the claims that follow.

The invention claimed is:

1. A method for mixing a cleaning solution that simultaneously cleans surfaces of dielectric material and copper prior to an electroless deposition of a capping layer, comprising:
   providing a core mixture produced by mixing a hydrocarboxylic acid in a concentration range from about 0.05 molar to about 1 molar with a pH adjuster;
   combining the core mixture with a sulfur containing compound selected from at least one member of the group consisting of sulfuric acid and methanesulfonic acid in a concentration range from about 0.05 Normal to 1 Normal, wherein the ratio of the unit volume of the core mixture to the sulfur containing compound is between 1:100 and 100:1.

2. The method of claim 1, wherein the hydrocarboxylic acid is a citric acid solution.

3. The method of claim 1, wherein the pH adjuster is selected from at least one member of the group consisting of tetra-methyl ammonium hydroxide and ammonia.

4. The method of claim 1, wherein the pH of the core mixture is about 2.5.

5. The method of claim 1, further comprising adding an additive to the cleaning solution, the additive selected from at least one member of the group consisting of hydrochloric acid in a concentration range of less than 1 parts per billion to 0.5% by volume, 49% by volume hydrofluoric acid at a concentration of 10 parts per million to 2% by volume, methanesulfonic acid at a concentration range of less than 10 ppm to 30% by volume, ethylenediaminetetraacetic acid at less than 1% concentration and poly ethylene glycol at less than 1% concentration.

6. A method for depositing a metal capping layer on at least one metal feature of a semiconductor wafer, comprising:
   providing a planarized substrate having the at least one metal feature formed at a surface of the substrate;
   applying a cleaning solution to the substrate to simultaneously clean the at least one metal feature and a dielectric material of the substrate, the cleaning solution comprising:
     a core mixture produced by mixing a hydrocarboxylic acid with a pH adjuster; wherein the mixing concentration range from about 0.05 molar to about 1 molar in the core mixture
     a sulfur containing compound selected from at least one member of the group consisting of sulfuric acid and sulfonic compounds; wherein the ratio of the unity volume of the core mixture to the sulfur containing compound is between 1:100 and 100:1 and
   depositing the metal capping layer selectively on the at least one metal feature using electroless deposition.

7. The method of claim 6, wherein the metal capping layer is a cobalt alloy.

8. The method of claim 6, wherein the hydrocarboxylic acid is a citric acid solution.

9. The method of claim 6, wherein the sulfur containing compound is selected from at least one member of the group consisting of sulfuric acid and methanesulfonic acid in a concentration range from about 0.05 Normal to 1 Normal and the ratio of the unit volume of the core mixture to the sulfur containing compound is between 1:100 and 100:1.

10. The method of claim 6, wherein the pH adjuster is selected from at least one member of the group consisting of tetra-methyl ammonium hydroxide and ammonia.

11. The method of claim 6, wherein the pH of the core mixture is about 2.5.

12. The method of claim 6, further comprising rinsing the substrate with deionized water.

* * * * *